United States Patent
Nara et al.

(10) Patent No.: US 12,209,046 B2
(45) Date of Patent: Jan. 28, 2025

(54) GLASS SUBSTRATE FOR EUVL, MANUFACTURING METHOD THEREOF, MASK BLANK FOR EUVL, AND MANUFACTURING METHOD THEREOF

(71) Applicant: AGC Inc., Tokyo (JP)

(72) Inventors: Takuma Nara, Tokyo (JP); Masahiko Tamura, Tokyo (JP); Satoshi Yamana, Tokyo (JP)

(73) Assignee: AGC Inc., Tokyo (JP)

( * ) Notice: Subject to any disclaimer, the term of this patent is extended or adjusted under 35 U.S.C. 154(b) by 795 days.

(21) Appl. No.: 17/245,585

(22) Filed: Apr. 30, 2021

(65) Prior Publication Data

US 2021/0355024 A1    Nov. 18, 2021

(30) Foreign Application Priority Data

May 13, 2020  (JP) .................................. 2020-084729
Feb. 15, 2021  (JP) .................................. 2021-021787

(51) Int. Cl.
| | | |
|---|---|---|
| C03C 15/00 | (2006.01) | |
| C03C 3/06 | (2006.01) | |
| C03C 21/00 | (2006.01) | |
| G03F 1/22 | (2012.01) | |
| G03F 1/52 | (2012.01) | |
| G03F 1/54 | (2012.01) | |

(52) U.S. Cl.
CPC ................ *C03C 15/00* (2013.01); *C03C 3/06* (2013.01); *C03C 21/007* (2013.01); *G03F 1/22* (2013.01); *G03F 1/52* (2013.01); *G03F 1/54* (2013.01); *C03C 2201/12* (2013.01); *C03C 2201/42* (2013.01); *C03C 2204/08* (2013.01)

(58) Field of Classification Search
CPC ... C03C 15/00; C03C 21/007; C03C 2201/12; C03C 2201/26; C03C 2201/42; C03C 2204/08; C03C 3/06; G03F 1/22; G03F 1/52; G03F 1/54; G03F 1/60
See application file for complete search history.

(56) References Cited

FOREIGN PATENT DOCUMENTS

| JP | 2009-155170 A | 7/2009 | |
|---|---|---|---|
| WO | WO-2009084296 A1 * | 7/2009 | ............. B82Y 10/00 |

* cited by examiner

*Primary Examiner* — Shuangyi Abu Ali
(74) *Attorney, Agent, or Firm* — Oblon, McClelland, Maier & Neustadt, L.L.P.

(57) ABSTRACT

A glass substrate for EUVL includes a first main surface having a rectangular shape; a second main surface having a rectangular shape on an opposite side to the first main surface; four end surfaces orthogonal to the first and second main surfaces; four first chamfered surfaces formed on boundaries between the first main surface and the end surfaces; and four second chamfered surfaces formed on boundaries between the second main surface and the end surfaces. The glass substrate for EUVL is formed of quartz glass containing $TiO_2$. The end surfaces include fluorine (F) and an element (A) other than fluorine that forms a gas cluster with fluorine, and satisfy relations:

$$S1 = \int_0^{x=50[nm]} \{D1(x) - (a1x+b1)\}dx > 0.2 \quad (1)$$

$$S2 = \int_0^{x=50[nm]} \{D2(x) - (a2x+b2)\}dx > 0.03 \quad (2)$$

20 Claims, 13 Drawing Sheets

GLASS SUBSTRATE FOR EUVL, MANUFACTURING METHOD THEREOF, MASK BLANK FOR EUVL, AND MANUFACTURING METHOD THEREOF

CROSS-REFERENCE TO RELATED APPLICATION

The present application claims priority under 35 U.S.C. § 119 to Japanese Patent Applications No. 2020-084729, filed May 13, 2020, and No. 2021-021787, filed Feb. 15, 2021. The contents of which are incorporated herein by reference in their entirety.

BACKGROUND OF THE INVENTION

1. Field of the Invention

The disclosures herein generally relate to a glass substrate for EUVL, a manufacturing method thereof, a mask blank for EUVL, and a manufacturing method thereof.

2. Description of the Related Art

Conventionally, the photolithography technique has been used for manufacturing semiconductor devices. In the photolithography technique, by using an exposure device, light is irradiated to a photomask pattern, and thereby the photomask pattern is transferred to a resist film.

Recently, in order to make possible to transfer a fine pattern, irradiation with short wavelength exposure light, such as ArF excimer laser light, furthermore EUV (Extreme Ultra-Violet) light, has been studied.

The above-mentioned EUV light includes soft X-ray and vacuum ultraviolet light.

Specifically, the EUV light has a wavelength of 0.2-100 nm. At present, EUV light with a wavelength of about 13.5 nm is mainly studied as the exposure light.

Japanese unexamined patent application publication No. 2009-155170 discloses a manufacturing method of a mask blank for EUVL (Extreme Ultra-Violet Lithography). The mask blank for EUVL includes a grass substrate, a reflection film formed on the glass substrate, and an absorption film formed on the reflection film.

In order to improve transfer accuracy of a fine pattern, high flatness is required for the mask blank for EUVL. Because the flatness of the mask blank for EUVL is mainly determined by flatness of a glass substrate, high flatness is required for the glass substrate.

Then, in order to improve the flatness of the glass substrate, an etching process of irradiating a main surface of the glass substrate with a beam of gas clusters is performed. The main surface of the glass substrate is etched locally with gas clusters, and thereby made flat.

Japanese unexamined patent application publication No. 2009-155170 discloses implantation of fluorine or chlorine atoms in a glass substrate to a depth of about 100 nm from the main surface of the glass substrate by the irradiation of gas clusters. According to the technique disclosed in Japanese unexamined patent application publication No. 2009-155170, a compression stress layer is generated on the main surface of the glass substrate, and thereby strength of the main surface of the glass substrate is improved.

SUMMARY OF THE INVENTION

The glass substrate for EUVL will be subjected to a polishing process, an inspection process, a film deposition process, and the like after the etching process of irradiating with gas clusters. These processes are referred to as post processes as a whole.

In the post process, an end surface of the glass substrate is pressed to a holding device, a positioning device or the like. Thus, the end surface easily gets a flaw. Moreover, instead of the end surface, or in addition to the end surface, a notch surface may be pressed to the holding device or the positioning device.

The notch surface is formed as inclined toward the main surface so as to cut off a corner of the two adjacent end surfaces and the main surface. The notch surface indicates an orientation of the glass substrate, and the notch surface is pressed to the holding device or the positioning device, so that the glass substrate is placed on various apparatuses in a desired orientation.

Moreover, the notch surface may not be formed.

Formation of a flaw on the end surface or the notch surface is inevitable. However, if such a flaw extends to be a large defect, the glass substrate will be disposed of as a defective product. Thus, a yield will be reduced.

An aspect of the present disclosure provides a technique of suppressing an extension of a flaw formed on the end surface or the notch surface of the glass substrate for EUVL.

According to an aspect of the present disclosure, a glass substrate for EUVL includes a first main surface having a rectangular shape; a second main surface having a rectangular shape and being on an opposite side to the first main surface; four end surfaces being orthogonal to the first main surface and the second main surface; four first chamfered surfaces formed on boundaries between the first main surface and the four end surfaces respectively; and four second chamfered surfaces formed on boundaries between the second main surface and the four end surfaces respectively. The glass substrate for EUVL is formed of quartz glass containing titanium dioxide ($TiO_2$). The end surfaces include fluorine (F) and an element (A) other than fluorine that forms a gas cluster with fluorine, and satisfy following relations (1) and (2):

[Math 1]
$$S1 = \int_0^{x=50[nm]} \{D1(x) - (a1x + b1)\}dx > 0.2 \quad (1)$$

[Math 2]
$$S2 = \int_0^{x=50[nm]} \{D2(x) - (a2x + b2)\}dx > 0.03 \quad (2)$$

where D1(x) in the relation (1) represents an intensity of fluorine (F) normalized with an intensity of silicon (Si) measured by Time-of-Flight Secondary Ion Mass Spectrometry (TOF-SIMS), x represents a depth from the end surface (in units of nm), a1x+b1 represents a linear expression of x obtained by approximating D1(x) using a least squares method for x which is greater than or equal to 200 and less than or equal to 400, D2(x) in the relation (2) represents an intensity of the element (A) normalized with an intensity of silicon (Si) measured by the TOF-SIMS, x represents a depth from the end surface (in units of nm), and a2x+b2 represents a linear expression of x obtained by approximating D2(x) using the least squares method for x which is greater than or equal to 200 and less than or equal to 400.

According to another aspect of the present disclosure, a glass substrate for EUVL includes a first main surface having a rectangular shape; a second main surface having a rectangular shape and being on an opposite side to the first main surface; four end surfaces being orthogonal to the first main surface and the second main surface; four first chamfered surfaces formed on boundaries between the first main surface and the four end surfaces respectively; four second chamfered surfaces formed on boundaries between the second main surface and the four end surfaces respectively; one or more notch surfaces formed as inclined toward the first main surface so as to cut off a corner of the two adjacent end surfaces and the first main surface. The glass substrate for EUVL is formed of quartz glass containing titanium dioxide ($TiO_2$). The notch surface includes fluorine (F) and an element (A) other than fluorine that forms a gas cluster with fluorine, and satisfies following relations (3) and (4):

[Math 3]

$$S3 = \int_0^{x=50[nm]} \{D3(x) - (a3x + b3)\}dx > 0.2 \quad (3)$$

[Math 4]

$$S4 = \int_0^{x=50[nm]} \{D4(x) - (a4x + b4)\}dx > 0.3 \quad (4)$$

where D3(x) in the relation (3) represents an intensity of fluorine (F) normalized with an intensity of silicon (Si) measured by the TOF-SIMS, x represents a depth from the notch surface (in units of nm), a3x+b3 represents a linear expression of x obtained by approximating D3(x) using the least squares method for x which is greater than or equal to 200 and less than or equal to 400, D4(x) in the relation (4) represents an intensity of the element (A) normalized with an intensity of silicon (Si) measured by the TOF-SIMS, x represents a depth from the notch surface (in units of nm), and a4x+b4 represents a linear expression of x obtained by approximating D4(x) using the least squares method for x which is greater than or equal to 200 and less than or equal to 400.

Effect of the Invention

According to an aspect of the present disclosure, an extension of a flaw formed on the end surface or the notch surface of the glass substrate for EUVL can be suppressed.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

Figure 1:
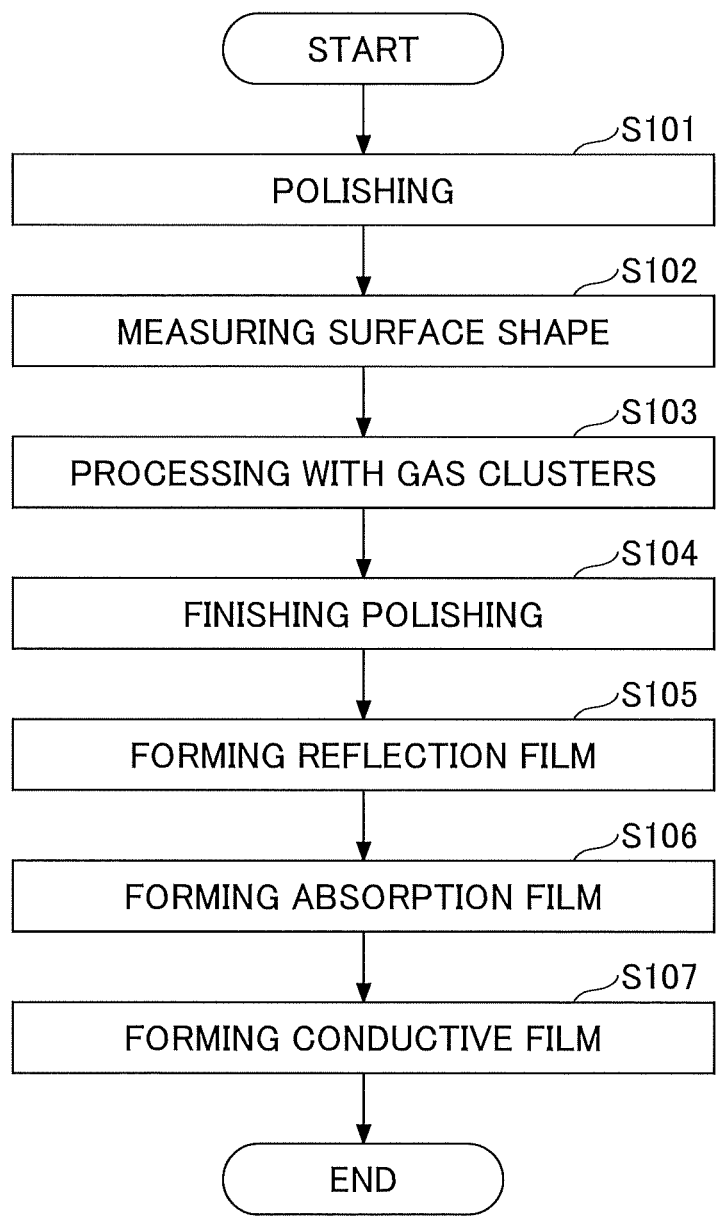
FIG. 1 is a flowchart showing a manufacturing method of a mask blank for EUVL according to an embodiment of the present invention.

In the following, embodiments of the present disclosure will be described with reference to the accompanying drawings. In each drawing, to the same or corresponding configurations, the same reference numeral will be assigned, and an explanation may be omitted. In the specification, a symbol "-" representing a numerical range indicates that values before and after the symbol are included as a lower limit value and an upper limit value, respectively.

As shown in FIG. 1, a manufacturing method for a mask blank for EUVL (Extreme Ultra-Violet Lithography) includes steps S101-S107. A glass substrate is used for manufacturing the mask blank. Glass of the glass substrate is preferably quartz glass that includes titanium dioxide ($TiO_2$). The linear expansion coefficient of quartz glass is less than that of typical soda lime glass, and variation in dimension with temperature change is small. The quartz glass may include 80-95 mass % $SiO_2$ and 4-17 mass % $TiO_2$. When the content amount of $TiO_2$ falls within a range of 4-17 mass %, the linear expansion coefficient at around a room temperature is approximately zero, and almost no variation in dimension occurs at around the room temperature. The quartz glass may include a third component other than $SiO_2$ and $TiO_2$ or impurity. For such a quartz glass, for example, the ULE (trademark registered) 7973 series of Corning Incorporated may be used.

Figure 2:
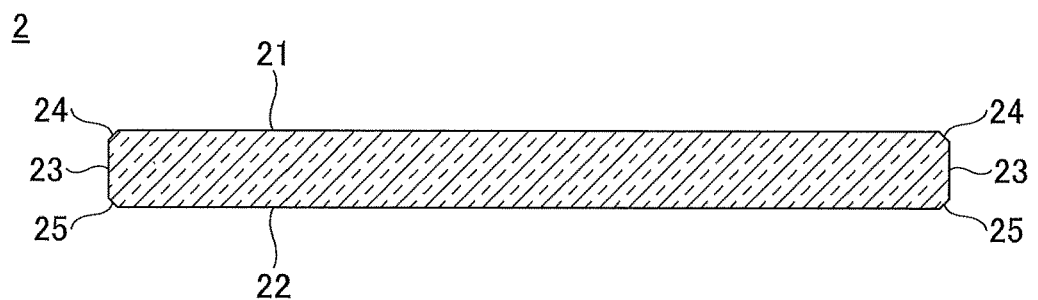
FIG. 2 is a cross-sectional view of an example of a glass substrate provided to the process of step S101 in FIG. 1.
Figure 3:
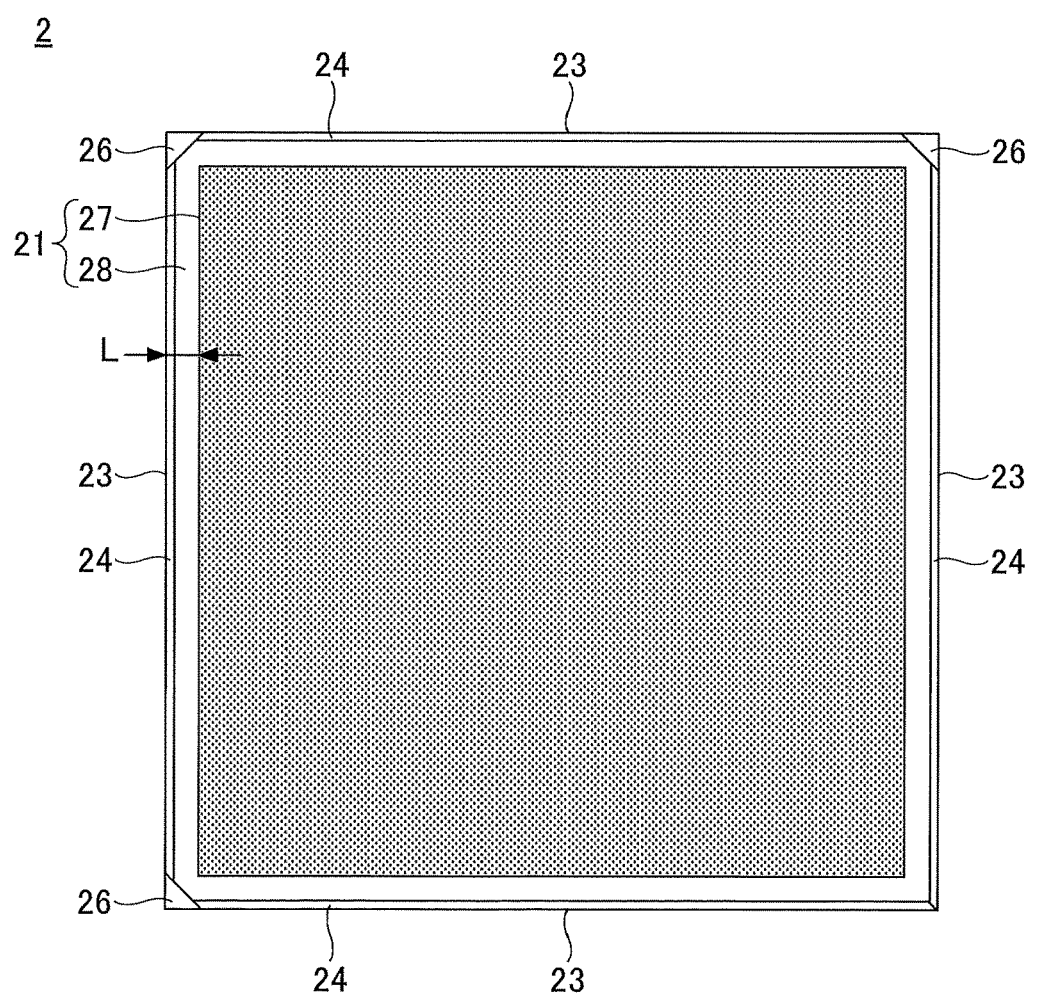
FIG. 3 is a plan view of the example of the glass substrate shown in FIG. 2.

A glass substrate 2 includes, a first main surface 21, a second main surface 22, four end surfaces 23, four first chamfered surfaces 24, four second chamfered surfaces 25, and three notch surfaces 26, as shown in FIGS. 2 and 3. The first main surface 21 has a rectangular shape. In the specification of the present application, the rectangular shape includes a shape in which chamfering was processed at a corner. Moreover, the rectangle includes a square. The second main surface 22 is on an opposite side to the first main surface 21. The second main surface 22 also has a rectangular shape. The end surfaces 23 are orthogonal to the first main surface 21 and the second main surface 22. The first chamfered surfaces 24 are formed on boundaries between the first main surface 21 and the end surfaces 23. The second chamfered surfaces 25 are formed on boundaries between the second main surface 22 and the end surfaces 23. In the embodiment of the present disclosure, the surface 24 and the second chamfered surface 25 are so-called C-chamfered surfaces, but may be R-chamfered surfaces. The notch surface 26 is formed as inclined toward the first main surface 21 so as to cut off a corner of the two adjacent end surfaces 23 and the first main surface 21. The notch surface 26 indicates an orientation of the glass substrate 2, and the glass substrate 2 is placed on various apparatuses in a desired orientation. The number of notch surfaces 26 is three in the embodiment of the present application. The number may be greater than or equal to one, and is not particularly limited. For example, even when the number of the notch surfaces 26 is four, if the notch surface 26 having different size from the other notch surfaces 26 is present, the orientation of the glass substrate 2 can be determined. Moreover, the notch surface 26 may not be present, i.e. the number of notch surfaces 26 may be zero.

The first main surface 21 of the glass substrate 2 includes a quality assurance area 27 shown by a dot pattern in FIG. 3. The quality assurance area 27 is an area to be processed according to steps S101-S104 so as to have a desired flatness. Moreover, the quality assurance area 27 is defined, for example, by removing from the entire area of the first main surface 21 a peripheral area 28 in which a distance L from the end surface 23 is less than or equal to 5 mm. Furthermore, although not shown in the drawings, the second main surface 22 of the glass substrate 2 also includes a quality assurance area and a peripheral area similarly to the first main surface 21.

Firstly, the first main surface 21 and the second main surface 22 of the glass substrate 2 are polished (step S101 in FIG. 1). The first main surface 21 and the second main surface 22 may be polished simultaneously by using a double side polishing device, or sequentially by using a single side polishing device. In step S101, the glass substrate 2 is polished while supplying polishing slurry between a polishing pad and the glass substrate 2. The polishing slurry includes abrasive. The abrasive is, for example, of cerium oxide particles. The first main surface 21 and the second main surface 22 may be polished multiple times, by using abrasives having different materials or different granularities.

The abrasive used at step S101 is not limited to cerium oxide particles. For example, the abrasive used at step S101 may be of silicon oxide particles, aluminum oxide particles, zirconium oxide particles, titanium oxide particles, diamond particles, or silicon carbide particles.

Next, surface shapes of the first main surface 21 and the second main surface 22 of the glass substrate 2 are measured (step S102 in FIG. 1). For measuring the surface shapes, a noncontact type, for example, laser interference type, measuring device is used so as not to make a flaw on the surface. By using the measuring device, surface shapes of the quality assurance area 27 in the first main surface 21 and surface shapes of the quality assurance area in the second main surface 22 are measured.

Then, referring to results of the measurement at step S102, the first main surface 21 and the second main surface 22 of the glass substrate 2 are processed with a beam of gas clusters in order to enhance the flatness (step S103 in FIG. 1). The first main surface 21 and the second main surface 22 are etched sequentially with the gas clusters. The order of the etching processes is not particularly limited.

Gas clusters are ionized according to collision by thermal electrons. Then, the gas clusters are accelerated by an electric field. After neutralization for the gas clusters, the first main surface 21 or the second main surface 22 is irradiated with the gas clusters. According to the collision by the gas clusters, the first main surface 21 or the second main surface 22 is etched locally, and made flat. The process of step S103 will be described later in detail.

Next, finishing polish is performed for the first main surface 21 and the second main surface 22 of the glass substrate 2 (step S104 in FIG. 1). The first main surface 21 and the second main surface 22 may be polished simultaneously by using a double side polishing device, or sequentially by using a single side polishing device. In step S104, the glass substrate 2 is polished while supplying polishing slurry between a polishing pad and the glass substrate 2. The polishing slurry includes abrasive. The abrasive is, for example, of colloidal silica particles.

Figure 4:
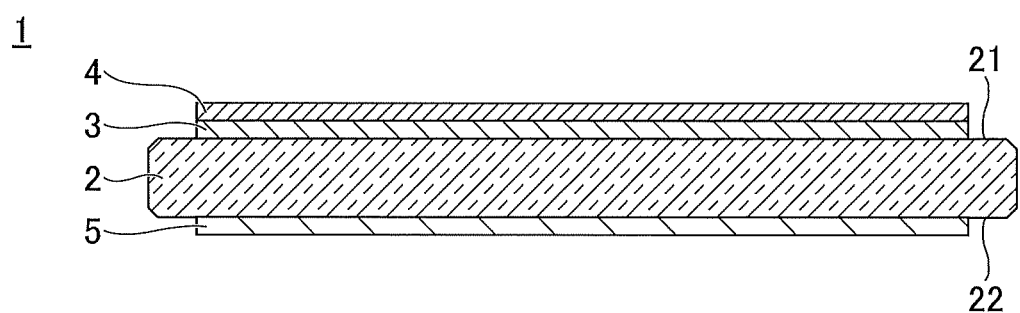
FIG. 4 is a cross-sectional view of an example of a mask blank for EUVL according to an embodiment of the present invention.

Next, a reflection film 3 is formed in the quality assurance area 27 of the first main surface 21 of the glass substrate 2, as shown in FIG. 4 (step S105 in FIG. 1). The reflection film 3 reflects EUV light. The reflection film 3 may be, for example, a multilayer reflection film in which a high refractive index layer and a low refractive index layer are alternately laminated. The high refractive index layer is formed of, for example, silicon (Si), and the low refractive index layer is formed of, for example, molybdenum (Mo). The reflection film 3 is deposited by using a sputtering method, such as ion beam sputtering method, or magnetron sputtering method.

Then, an absorption film 4 is formed on the reflection film 3 formed at step S105, as shown in FIG. 4 (step S106 in FIG. 1). The absorption film 4 absorbs EUV light. The absorption film 4 is formed of, for example, a single metal, alloy, nitride, oxide, oxynitride, or the like including at least one element selected from tantalum (Ta), chromium (Cr), and palladium (Pd). The absorption film 4 is deposited by using, for example, a sputtering method.

Finally, a conductive film 5 is formed in the quality assurance area of the second main surface 22 of the glass substrate 2, as shown in FIG. 4 (step S107 in FIG. 1). The conductive film 5 is used for electrostatically attracting a photomask when the glass substrate 2 is placed on an electrostatic chuck of an exposure apparatus. The conductive film 5 is formed of chromium nitride (CrN) or the like. The conductive film 5 is deposited by using, for example, a sputtering method. In the embodiment of the present disclosure, step S107 is performed after steps S105 and S106. However, step S107 may be performed before steps S105 and S106.

The reflection film 3 and the conductive film 5 may be arranged differently from the above-described configuration. That is, the conductive film 5 may be formed in the quality assurance area 27 of the first main surface 21 of the glass substrate 2, and the reflection film 3 may be formed in the quality assurance area of the second main surface 22 of the glass substrate 2. In this case, the absorption film 4 is formed on the reflection film 3.

According to the above-described processes, steps S101-S107, the mask blank for EUVL 1, shown in FIG. 4, is obtained. The mask blank for EUVL 1 includes the glass substrate 2, the reflection film 3, the absorption film 4, and the conductive film 5. The mask blank for EUVL 1 may not include the conductive film 5. Moreover, the mask blank for EUVL 1 may further include another film.

Figure 5:
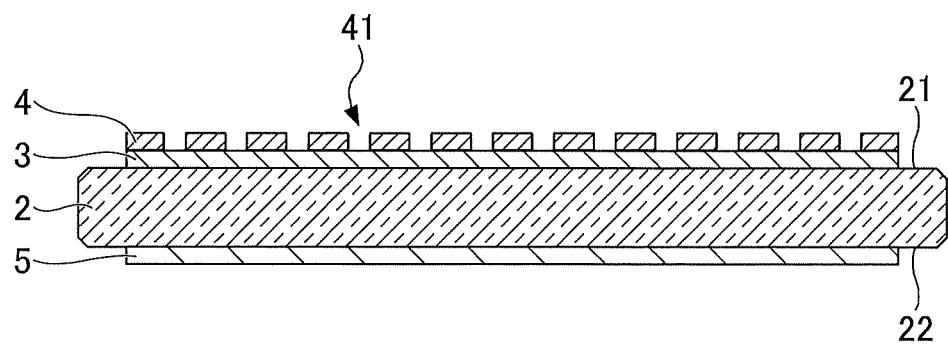
FIG. 5 is a cross-sectional view of an example of a photomask for EUVL.

For example, the mask blank for EUVL 1 may further include a low reflection film. The low reflection film is formed on the absorption film 4. The low reflection film is used for inspecting opening patterns 41 of the absorption film 4, as shown in FIG. 5. The low reflection film has a reflection characteristic which is lower than that of the absorption film 4 for inspection light. The low reflection film is formed of, for example, tantalum oxynitride (TaON), or tantalum oxide (TaO). The low reflection film is deposited by using, for example, sputtering method.

Moreover, the mask blank for EUVL 1 may further include a protection film. The protection film is formed between the reflection film 3 and the absorption film 4. The protection film protects the reflection film 3, so that the reflection film 3 is not etched, when the absorption film 4 is etched in order to form the opening patterns 41 in the absorption film 4. The protection film is formed of, for example, ruthenium (Ru), silicon (Si), or titanium dioxide ($TiO_2$). The protection film is deposited by using, for example, sputtering method.

The photomask for EUVL is obtained by forming the opening patterns 41 in the absorption film 4, as shown in FIG. 5. The opening patterns 41 are formed by using a photolithography method and etching method. Thus, a resist film used for forming the opening patterns 41 may be included in the mask blank for EUVL 1.

Figure 6:
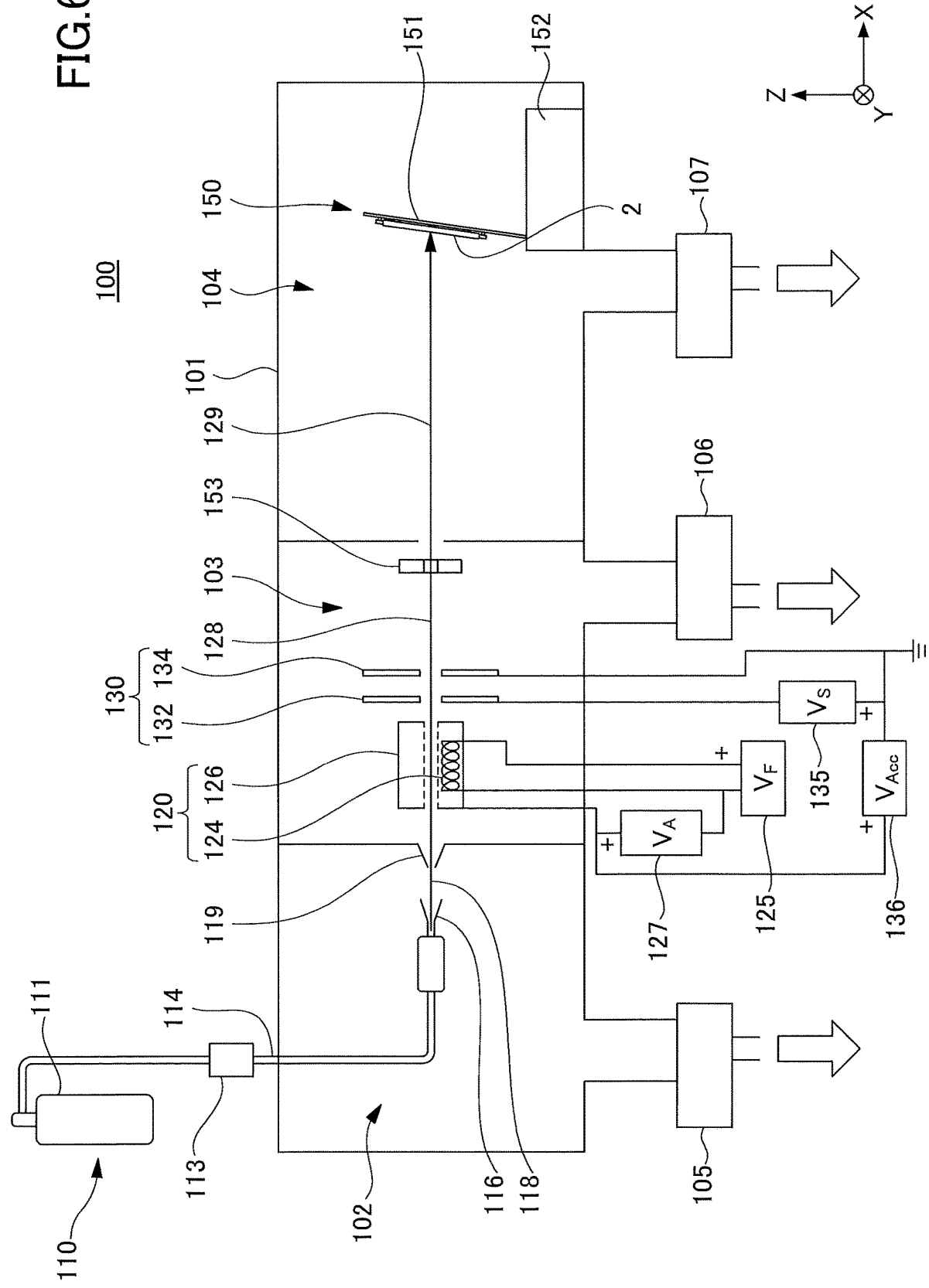
FIG. 6 is a cross-sectional view of a machining apparatus according to an embodiment of the present invention.

Next, with reference to FIG. 6, a machining apparatus used at step S103 in FIG. 1 will be described. The machining apparatus 100 is, so called, a GCIB (Gas Cluster Ion Beam) machining apparatus.

The machining apparatus 100 includes a vacuum vessel 101. The vacuum vessel 101 includes a nozzle chamber 102, an ionization/acceleration chamber 103, and a processing chamber 104. The three chambers 102, 103 and 104 are connected to each other, to form passages of gas clusters. The three chambers 102, 103 and 104 are evacuated by three vacuum pumps 105, 106 and 107, respectively, and desired degrees of vacuum are maintained. The number of chambers and the number of vacuum pumps are not particularly limited.

The machining apparatus 100 includes a generation unit 110. The generation unit 110 generates gas clusters. The generation unit 110 includes, for example, a raw material tank 111, a pressure controller 113, a supply pipe 114, and a nozzle 116. The raw material tank 111 stores raw material gas (e.g. tetrafluoromethane ($CF_4$) gas). The pressure controller 113 controls a supply pressure of the raw material gas supplied from the raw material tank 111 to the nozzle 116 through the supply pipe 114. The nozzle 116 is provided in the nozzle chamber 102, and injects the raw material gas into a vacuum to form an ultrasonic gas jet 118.

The raw material gas is cooled in the gas jet 118 by adiabatic expansion. Then, a part of the gas jet 118 is condensed into gas clusters, each of which is an aggregate of a few to several thousands of atoms or molecules. Gas clusters are mainly included around a center of a flow of the gas jet 118. Thus, by allowing only the part around the center of the flow of the gas jet 118 to pass through by using a skimmer 119, gas clusters can be provided efficiently.

The raw material gas is not limited to tetrafluoromethane ($CF_4$) gas, but $CHF_3$ gas, $CH_2F_2$ gas, $C_2F_6$ gas, $BF_3$ gas, $NF_3$ gas, $SF_6$ gas, $SeF_6$ gas, $TeF_6$ gas, or $WF_6$ gas may be used. Details will be described later. Among the above-described gases, $CF_4$ gas, $CHF_3$ gas, or $CH_2F_2$ gas is preferably used. A plurality of gases may be selected from the above-described gasses, so that mixed gas is used as the raw material gas.

The machining apparatus 100 includes an ionization unit 120. The ionization unit 120 ionizes at least a part of the gas clusters included in the gas jet 118. The ionization unit 120 includes, for example, one or more thermal filaments 124, and a cylindrical electrode 126. The thermal filament 124 generates heat by electric power (voltage $V_F$) supplied from a power source 125, and emits thermal electrons. The cylindrical electrode 126 accelerates the thermal electrons emitted from the thermal filament 124, to cause the accelerated thermal electrons to collide with the gas clusters. According to the collision of electrons with the gas clusters, electrons are emitted from a part of the gas clusters, thereby the gas clusters are positively ionized. When two or more electrons are emitted, the gas cluster is polyvalently ionized. Electric voltage $V_A$ supplied from a power source 127 is applied between the cylindrical electrode 126 and the thermal filament 124. By the voltage $V_A$ (electric field), thermal electrons are accelerated to collide with the gas clusters.

The machining apparatus 100 includes an acceleration unit 130. The acceleration unit 130 accelerates the gas clusters ionized by the ionization unit 120, to form a gas cluster ion beam (GCIB) 128. The acceleration unit 130 includes, for example, a first electrode 132 and a second electrode 134. The second electrode 134 is grounded, and a positive voltage $V_S$ supplied from a power source 135 is applied to the first electrode 132. Thus, the first electrode 132 and the second electrode 134 generate an electric field that accelerates positively ionized gas clusters. The accelerated gas clusters are extracted through an opening formed in the second electrode 134 as the GCIB 128. The power source 136 supplies to the first electrode 132 and the second electrode 134 acceleration voltage $V_{Acc}$ that biases the ionization unit 120, so that total GCIB acceleration voltage is equal to $V_{Acc}$. The acceleration voltage $V_{Acc}$ is for example 1-200 kV, preferably 1-70 kV.

The machining apparatus 100 may include a neutralization unit (not shown). The neutralization unit neutralizes the GCIB 128 formed by the acceleration unit 130, to form neutralized gas clusters. Because the glass substrate 2 is irradiated with neutralized gas clusters, the glass substrate 2 can be prevented from being electrified. However, even if the glass substrate 2 is irradiated with positively ionized gas clusters, the glass substrate 2 can be etched.

The machining apparatus 100 includes an irradiation unit 150. The irradiation unit 150 irradiates the glass substrate 2 with a beam of gas clusters 129, to locally etch the glass substrate 2. A half width of an intensity distribution of the beam of the gas clusters 129 is, for example, 1-30 mm. The irradiation unit 150 includes, for example, a stage 151, a stage moving mechanism 152, and an aperture 153. The stage 151 is provided in the processing chamber 104, and holds the glass substrate 2. The stage moving mechanism 152 moves the stage 151 two-dimensionally, along the Y-axis direction and the Z-axis direction, so as to move an irradiation point of the beam of the gas clusters 129 on the glass substrate 2. By controlling a moving speed, an amount of etching can be controlled, thereby the glass substrate 2 can be made flat. Moreover, the stage moving mechanism 152 can move the stage 151 also along the X-axis. Furthermore, the stage moving mechanism 152 can rotate the stage 151 around a rotation axis extending along the Y-axis direction. The aperture 153 is provided in the middle of the passage of the gas clusters 129, to enhance uniformity of intensity of the gas clusters 129. The gas clusters 129 pass through an opening provided in the aperture 153, and are emitted to the glass substrate 2.

Next, with reference to FIGS. 7-9, the irradiation unit 150 of the machining apparatus 100 will be described. In the specification of the present application, the X-axis direction, the Y-axis direction and the Z-axis direction are orthogonal to each other. The X-axis direction and the Y-axis direction are horizontal directions, and the Z-axis direction is a vertical direction. In the following description, the X-axis positive direction corresponds to a forward direction, and the X-axis negative direction corresponds to a backward direction. An irradiation direction of the gas clusters 129 indicated by an arrow in FIG. 7 corresponds to the X-axis positive direction.

Figure 7:
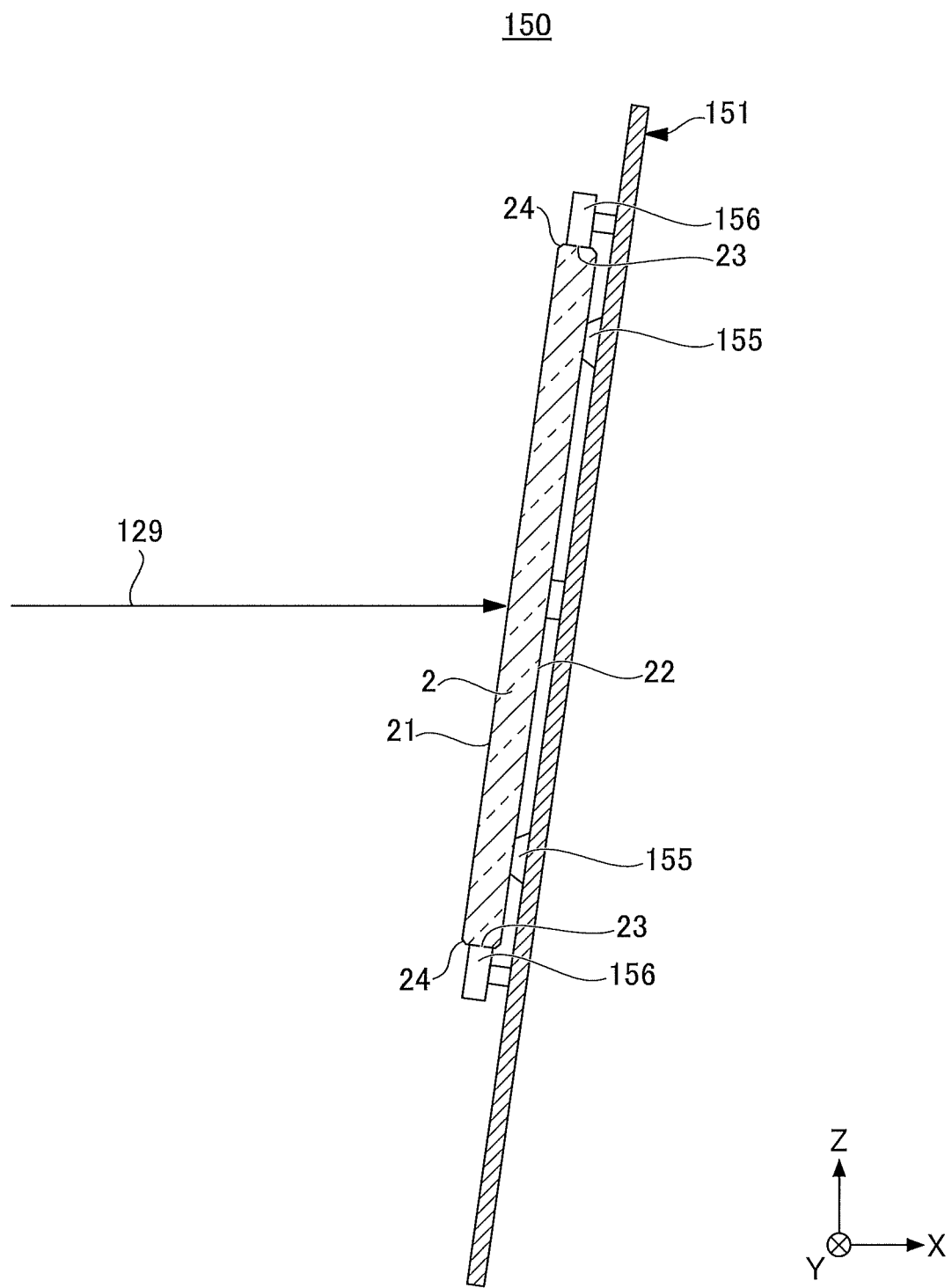
FIG. 7 is an enlarged view of the cross section of the glass substrate and peripheral parts thereof shown in FIG. 6.
Figure 8:
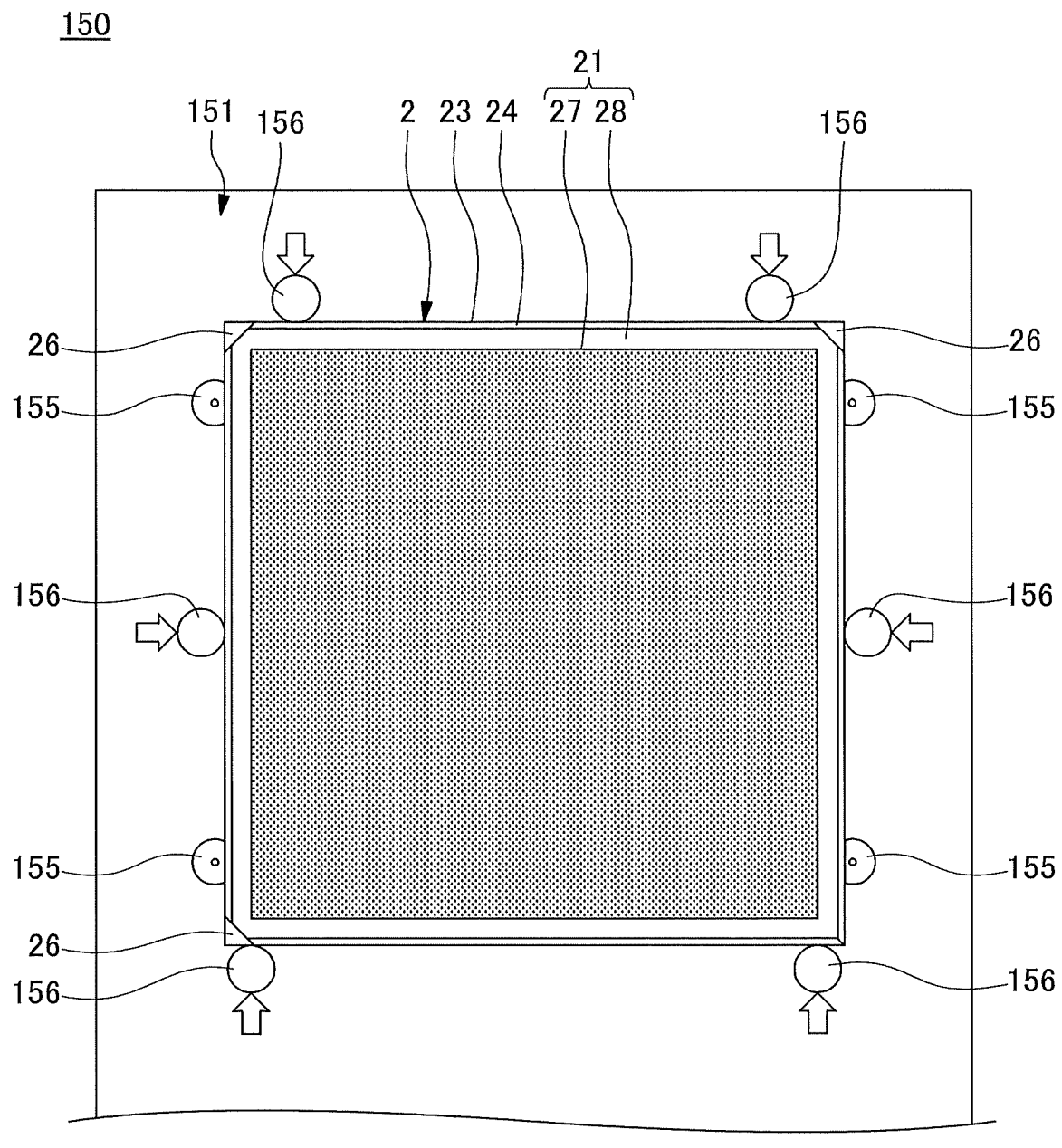
FIG. 8 shows the glass substrate and the peripheral parts thereof viewed from a direction of irradiation of gas clusters shown in FIG. 7.

As shown in FIG. 7, the irradiation unit 15 emits the gas clusters 129 in the forward direction, and thereby locally etches the first main surface 21, the end surfaces 23, the first chamfered surfaces 24, and the notch surface 26 with the emitted gas clusters 129. The first main surface 21 is arranged so as to be oriented in the backward direction, and obliquely upward inclined to the vertical direction. An oblique angle is not particularly limited, but for example 5 degrees. According to the arrangement in which the first main surface 21 is obliquely upward inclined to the vertical direction, the lower end surface 23 among the four end surfaces 23 can be directly irradiated with the beam of the gas clusters 129. Moreover, by reversing the arrangement of the glass substrate 2, the second main surface 22 and the second chamfered surfaces 25 of the glass substrate 2 can be locally etched.

Figure 9:
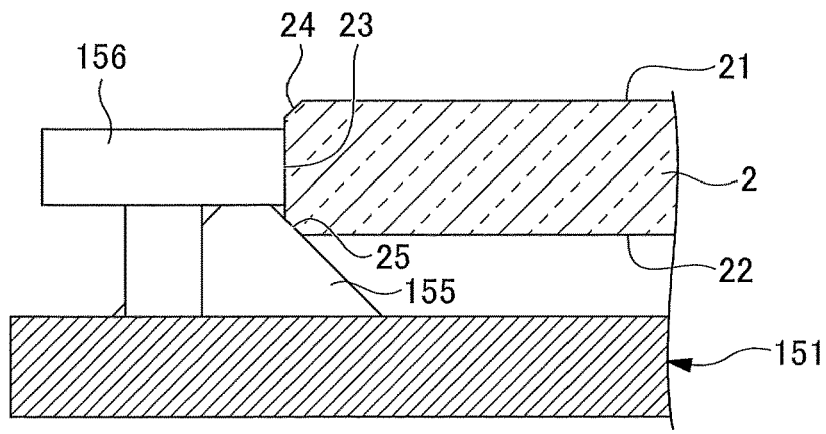
FIG. 9 shows a clamp and a spacer shown in FIG. 7 viewed from another direction.
Figure 9:
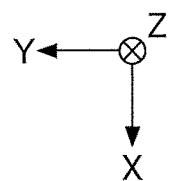

As shown in FIG. 9, the stage 151 is arranged so as to face the second main surface 22 of the glass substrate 2. The stage 151 is arranged in front of the glass substrate 2. The stage 151 may hold the glass substrate 2, for example, via a spacer 155. The spacer 155 forms a gap between the stage 151 and the glass substrate 2. Thus, contact flaws can be prevented from occurring on the second main surface 22, compared with the case where an entirety of the second main surface 22 of the glass substrate 2 is in contact with the stage 151.

The spacer 155 may have tapered surfaces. When the second chamfered surfaces 25 of the glass substrate 2 is held on the tapered surface of the spacer 155, nothing is in contact with the second main surface 22. Thus, contact flaws can be surely prevented from occurring on the second main surface 22. A part of the spacer 155 is arranged outside the glass substrate 2, viewed from the direction of irradiation of the gas clusters 129, as shown in FIG. 8.

In the embodiment of the present disclosure, a part of the spacer 155 is arranged outside the glass substrate 2, viewed from the direction of irradiation of the gas clusters 129. However, an entirety of the space 155 may be arranged inside the glass substrate 2. In this case, the spacer 155 is in contact with the peripheral area in the second main surface 22 excluding the quality assurance area, instead of the second chamfered surfaces 25 of the glass substrate 2.

Moreover, the stage 151 may hold the glass substrate 2 via a clamp 156. According to this configuration, the glass substrate 2 can be stably held in a vacuum. An entirety of the clamp 156 is arranged outside the glass substrate 2, viewed from the direction of irradiation of the gas clusters 129. The clamp 156 presses, for example, the end surface 23 of the glass substrate 2. The plurality of clamps 156 are placed along the periphery of the glass substrate 2 at intervals.

In the embodiment of the present disclosure, the clamp 156 presses the end surface 23 of the glass substrate 2. However, the clamp 156 may press the peripheral area 28 of the first main surface 21 of the glass substrate 2. Moreover, the clamp 156 may press the first chamfered surfaces 24 of the glass substrate 2. In these cases, a part of the clamp 156 is also arranged outside the glass substrate 2, viewed from the direction of irradiation of the gas clusters 129.

The glass substrate 2 is subjected to a polishing process, an inspection process, a film deposition process, and the like after the etching process of irradiating with the gas clusters 129. These processes are referred to as post processes as a whole. In the post processes, the end surfaces 23 of the glass substrate 2 are pressed to a holding device, a positioning device or the like. Thus, the end surfaces 23 easily get a flaw.

In the embodiment of the present disclosure, according to the irradiation of the gas clusters 129, fluorine (F) and an element other than fluorine (in the following, also referred to as "A") are implanted on the end surface 23 of the glass substrate 2, thereby glass near the end surface 23 is softened. The softened glass near the end surface 23 can be deformed so as to absorb a stress of extending a flaw. Thus, the extension of the flaw can be suppressed, and the yield can be prevented from being reduced.

The element (A) is not particularly limited as long as the element (A) and fluorine (F) form the gas cluster 129. The element (A) is, for example, carbon (C), boron (B), hydrogen (H), nitrogen (N), sulfur (S), selenium (Se), tellurium (Te), or tungsten (W). Details will be described later. The element (A) is preferably an element with a small number of valence electrons. Moreover, an element with a small atomic radius is preferable. Preferably, the element (A) is carbon (C), boron (B), or nitrogen (N), and more preferably, the element (A) is carbon (C).

Figure 10:
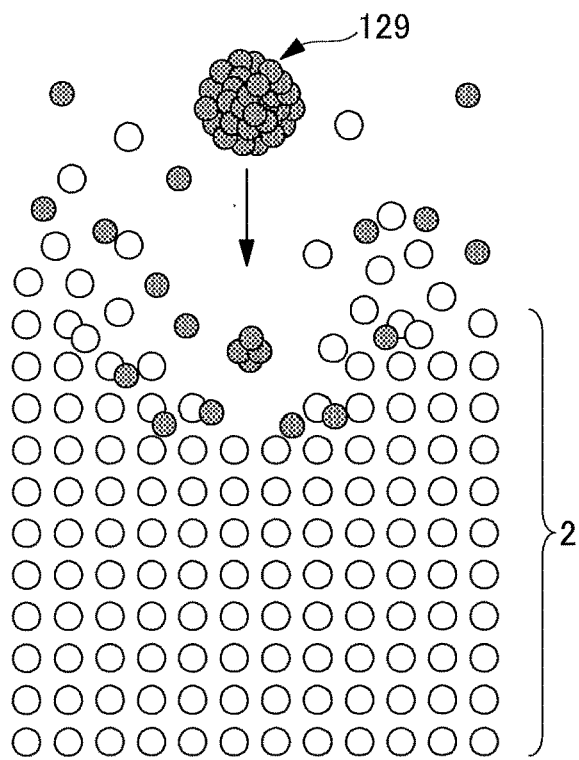
FIG. 10 schematically shows an example of collision of gas clusters to the glass substrate.

As shown in FIG. 10, when the glass substrate 2 is irradiated with the gas cluster 129, Si—O bonds near the glass surface are cut by fluorine having high reactivity. As a result, it is considered that atoms of silicon (Si), oxygen (O), fluorine (F), and the element (A) randomly bond to each other, the density becomes more distributed, and thereby the glass surface becomes soft.

When the density of the glass surface becomes more distributed, a compression stress does not occur on the glass surface, and the glass surface does not become hard. In order to make the density of the glass surface more distributed, the element (A) is preferably an element with a small number of valence electrons and with a small atomic radius. As described above, the element (A) is preferably carbon, boron or nitrogen, and more preferably carbon. The gas cluster 129 formed by the element (A) and fluorine (F) is preferably $CF_4$, $CHF_3$, $CH_2F_2$, $BF_3$, or $NF_3$, more preferably $CF_4$, $CHF_3$ or $CH_2F_2$. Fluorocarbons such as $CF_4$ are handled easily compared with boron fluoride ($BF_3$) and nitrogen fluoride ($NF_3$).

Moreover, when the density of the glass surface becomes more distributed, a compression stress does not occur on the glass surface, and deformation of the glass substrate 2 due to the compression stress does not occur. Accordingly, the flatness of the first main surface 21 and the second main surface 22 of the glass substrate 2 is excellent.

Atoms of fluorine (F) and the element (A) are implanted on the end surface 23 of the glass substrate 2. In the process of step S103 in FIG. 1, the gas clusters 129 can be directly emitted onto the end surface 23 of the glass substrate 2, or the direction of the gas clusters 129 can be changed by collision with peripheral parts of the glass substrate 2 so that the gas clusters 129 are implanted onto the end surface 23 of the glass substrate 2. Moreover, in order to directly emit the gas clusters 129 onto the four end surfaces 23 of the glass substrate 2, the process of step S103 in FIG. 1 may be performed a plurality of times, while rotating the glass substrate 2 by 90 degrees around a rotation axis which is approximately parallel to the X-axis and orthogonal to the first main surface 21. In this process, by controlling an irradiation time of the gas clusters 129 and coordinates of the position of the stage 151, amounts of atoms of fluorine (F) and the element (A) implanted onto the four end surfaces 23 can be controlled. The peripheral parts of the glass substrate 2 include, for example, the stage 151, the spacer 155, and the clamp 156.

The end surfaces 23 include atoms of fluorine (F) and the element (A), and the following relations (1) and (2) are satisfied:

[Math 5]

$$S1 = \int_0^{x=50[nm]} \{D1(x) - (a1x + b1)\}dx > 0.2 \quad (1)$$

[Math 6]

$$S2 = \int_0^{x=50[nm]} \{D2(x) - (a2x + b2)\}dx > 0.03 \quad (2)$$

where $D1(x)$ in the relation (1) represents an intensity of fluorine (F) normalized with an intensity of silicon (Si) measured by Time-of-Flight Secondary Ion Mass Spectrometry (TOF-SIMS), x represents a depth from the end surface 23 (in units of nm), a1x+b1 represents a linear expression of x obtained by approximating $D1(x)$ using a least squares method for x which is greater than or equal to 200 and less than or equal to 400, $D2(x)$ in the relation (2) represents an intensity of the element (A) normalized with an intensity of silicon (Si) measured by the TOF-SIMS, x represents a depth from the end surface 23 (in units of nm), and a2x+b2 represents a linear expression of x obtained by approximating $D2(x)$ using the least squares method for x which is greater than or equal to 200 and less than or equal to 400. The value of S1 on the left-hand side of the above-described relation (1) is preferably less than or equal to 10. Moreover, the value of S2 on the left-hand side of the above-described relation (2) is preferably less than or equal to 1.

As described above, the end surface 23 includes atoms of fluorine (F) and the element (A), and the above-described relations (1) and (2) are satisfied. Thus, the glass near the end surface 23, which is pressed to the holding device, the positioning device, and the like, can be made soft. The softened glass near the end surface 23 can be deformed so as to absorb a stress of extending a flaw. Thus, the extension of the flaw can be suppressed, and the yield can be prevented from being reduced.

Moreover, instead of the end surface 23, or in addition to the end surface 23, the notch surface 26 may be pressed to the holding device or the positioning device. In this case, formation of a flaw on the notch surface 26 is inevitable. However, if such a flaw extends to be a large defect, the glass substrate will be disposed of as a defective product. Thus, a yield will be reduced.

Then, by implanting atoms of fluorine (F) and the element (A) other than fluorine onto the notch surface 26 of the glass substrate 2 according to the irradiation with the gas clusters 129, the glass near the notch surface 26 may be made soft. The softened glass near the notch surface 26 can be deformed so as to absorb a stress of extending a flaw. Thus, the extension of the flaw can be suppressed, and the yield can be prevented from being reduced.

In the process of step S103 in FIG. 1, the gas clusters 129 can be directly emitted onto the notch surface 26 of the glass substrate 2, or the direction of the gas clusters 129 can be changed by collision with peripheral parts of the glass substrate 2 so that the gas clusters 129 are implanted onto the notch surface 26 of the glass substrate 2. Moreover, the process of step S103 in FIG. 1 may be performed a plurality of times, while rotating the glass substrate 2 by 90 degrees around a rotation axis which is approximately parallel to the X-axis and orthogonal to the first main surface 21. In this process, by controlling an irradiation time of the gas clusters 129 and coordinates of the position of the stage 151, amounts of atoms of fluorine (F) and the element (A) implanted onto the notch surfaces 26 can be controlled. The notch surface 26 is easily irradiated with the gas clusters 129 directly, compared with the end surfaces 23, and contents of fluorine (F) and the element (A) in the glass near the surface can be increased.

The notch surface 26 irradiated with the gas clusters 129 includes atoms of fluorine (F) and the element (A), and the following relations (3) and (4) are satisfied:

[Math 7]

$$S3 = \int_0^{x=50[nm]} \{D3(x) - (a3x + b3)\}dx > 0.2 \quad (3)$$

[Math 8]

$$S4 = \int_0^{x=50[nm]} \{D4(x) - (a4x + b4)\}dx > 0.3 \quad (4)$$

where $D3(x)$ in the relation (3) represents an intensity of fluorine (F) normalized with an intensity of silicon (Si) measured by TOF-SIMS, x represents a depth from the notch surface 26 (in units of nm), a3x+b3 represents a linear expression of x obtained by approximating $D3(x)$ using a least squares method for x which is greater than or equal to 200 and less than or equal to 400, $D4(x)$ in the relation (2) represents an intensity of the element (A) normalized with an intensity of silicon (Si) measured by the TOF-SIMS, x represents a depth from the notch surface 26 (in units of nm), and a4x+b4 represents a linear expression of x obtained by approximating $D4(x)$ using the least squares method for x which is greater than or equal to 200 and less than or equal to 400. The value of S3 on the left-hand side of the above-described relation (3) is preferably less than or equal to 10. Moreover, the value of S4 on the left-hand side of the above-described relation (4) is preferably less than or equal to 1.

As described above, the notch surface 26 includes atoms of fluorine (F) and the element (A), and the above-described relations (3) and (4) are satisfied. Thus, the glass near the notch surface 26, which is pressed to the holding device, the positioning device, and the like, can be made soft. The softened glass near the notch surface 26 can be deformed so as to absorb a stress of extending a flaw. Thus, the extension of the flaw can be suppressed, and the yield can be prevented from being reduced.

EXAMPLES

First Example

Figure 11:
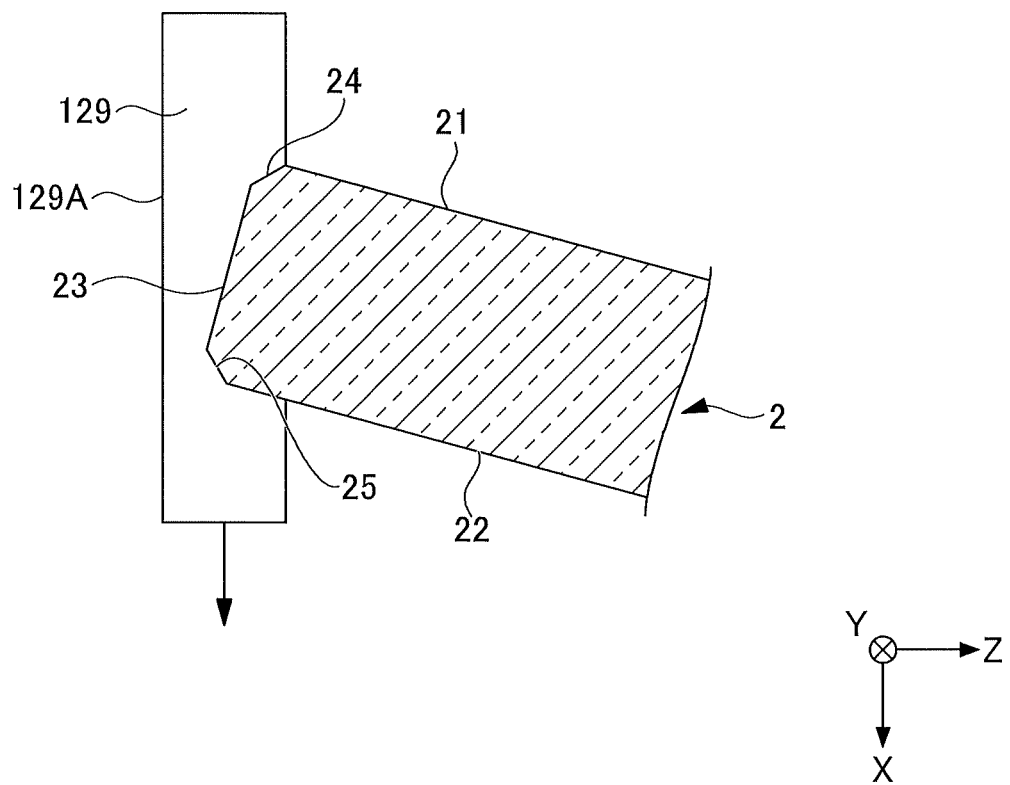
FIG. 11 schematically shows the irradiation of the end surface of the glass substrate with gas clusters according to a first example.

Next, with reference mainly to FIGS. 12-14, experimental data will be described. In the first example, the end surface 23 of the glass substrate 2 was directly irradiated with gas clusters 129. Specifically, as shown in FIG. 11, the first main surface 21 is arranged so as to be oriented in the backward direction, and obliquely upward inclined to the vertical direction, so that a beam 129A of the gas clusters 129 was made obliquely incident on the lower end surface 23 of the glass substrate 2. An oblique angle was 5 degrees. With this arrangement, the end surface 23 of the glass substrate 2 was directly irradiated with the gas clusters 129. The above-described process was performed a plurality of times, while rotating the glass substrate 2 by 90 degrees around a rotational axis which is approximately parallel to the X-axis and orthogonal to the first main surface 21, thereby the four end surfaces 23 were directly irradiated with the gas clusters 129. As raw material gas for the gas clusters 129, tetrafluoromethane ($CF_4$) gas was used, in which the element (A) other than fluorine (F) was carbon (C). After the irradiation with the gas clusters 129, composition analysis for the end surface 23 of the glass substrate 2 was performed by using the TOF-SIMS. A sample for the composition analysis was cut out from the end surface 23 of the glass substrate 2, and fixed to a holding tool so that the end surface 23 was made substantially horizontal facing upward. For the composition analysis of the end surface 23, TOF.SIMS 5 by IONTOF GmbH was used. For the glass substrate 2, quartz glass containing titanium dioxide ($TiO_2$) was used.

Figure 12:
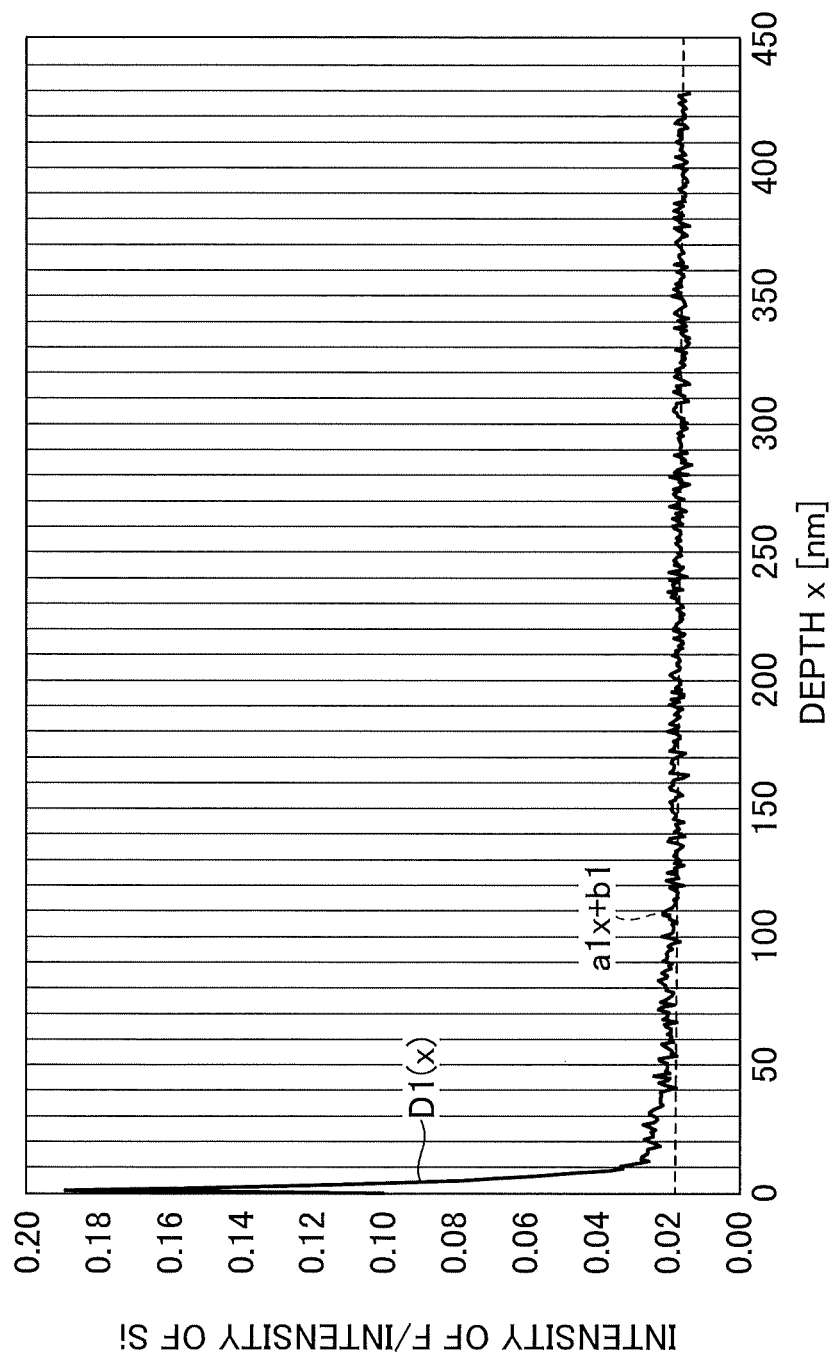
FIG. 12 shows a distribution in depth direction of a ratio of a fluorine (F) intensity to a silicon (Si) intensity obtained by measuring the end surface of the glass substrate according to the first example using TOF-SIMS.

FIG. 12 shows a distribution in depth direction of a ratio of a fluorine (F) intensity to a silicon (Si) intensity obtained by measuring the end surface 23 of the glass substrate 2 of the first example using the TOF-SIMS. It is clearly shown in FIG. 12 that fluorine (F) atoms were implanted near the end surface 23 of the glass substrate 2. The value of S1 on the left-hand side of the above-described relation (1) was 1.00. Moreover, the composition analysis for the end surface 23 performed before the irradiation with the gas clusters 129 using the TOF-SIMS shows that the value of S1 was 0.139.

Figure 13:
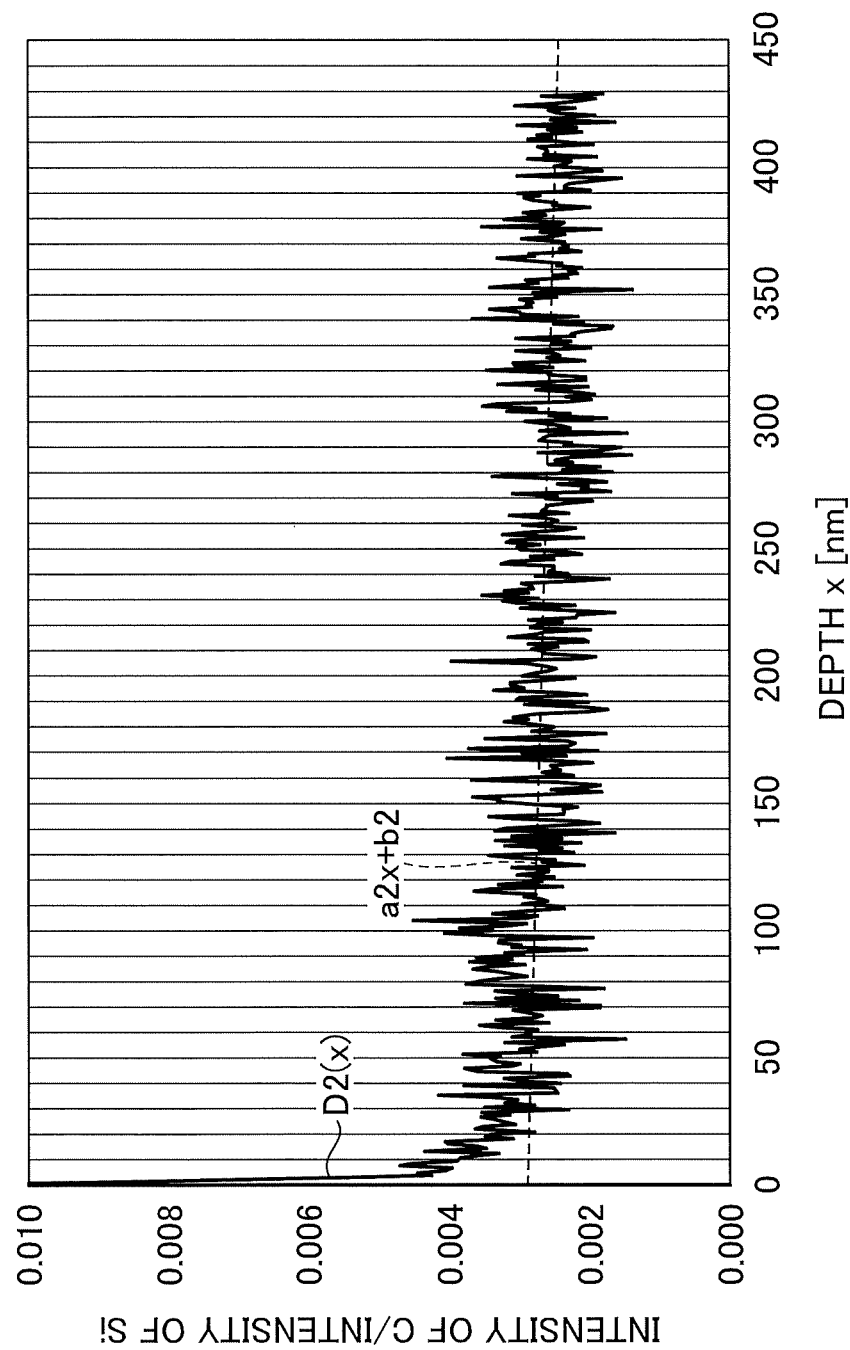
FIG. 13 shows a distribution in depth direction of a ratio of a carbon (C) intensity to a silicon (Si) intensity obtained by measuring the end surface of the glass substrate according to the first example using TOF-SIMS.

Moreover, FIG. 13 shows a distribution in depth direction of a ratio of a carbon (C) intensity to a silicon (Si) intensity obtained by measuring the end surface 23 of the glass substrate 2 of the first example using the TOF-SIMS. It is clearly shown in FIG. 13 that carbon (C) atoms were implanted near the end surface 23 of the glass substrate 2. The value of S2 on the left-hand side of the above-described relation (2) was 0.07. Moreover, the composition analysis for the end surface 23 performed before the irradiation with the gas clusters 129 using the TOF-SIMS shows that the value of S2 was 0.017.

Figure 14:
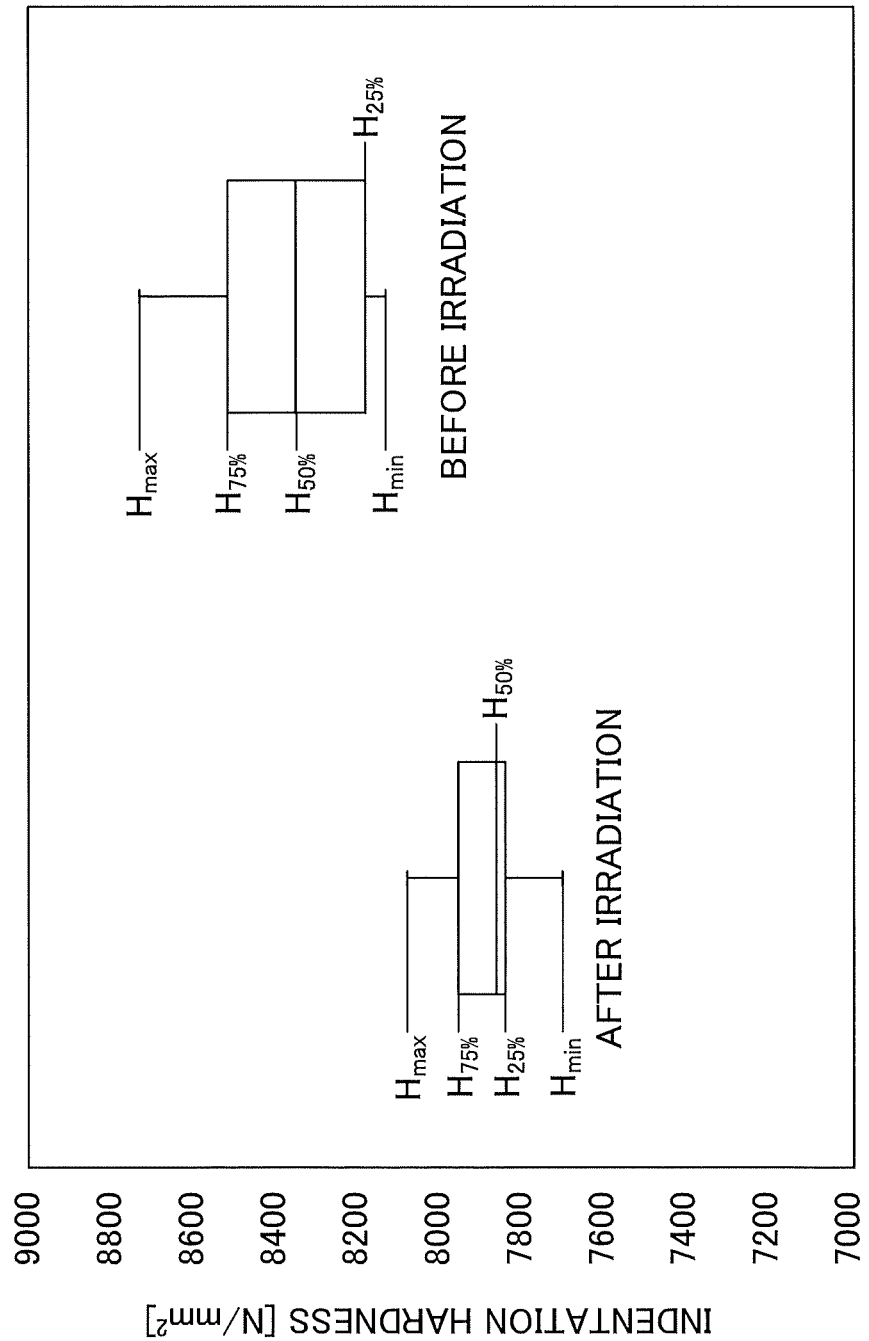
FIG. 14 is a diagram for comparing hardness of the end surface of the glass substrate according to the first example after the gas cluster irradiation with hardness before the gas cluster irradiation.

FIG. 14 shows hardness of the end surface 23 of the glass substrate 2 according to the first example measured before and after the irradiation with the gas clusters. The measurement of the hardness was performed using a nanoindentation tester by ELIONIX INC. (product name: ENT-1100a). Indentation load was 60 mN, retention time was 1000 ms, and a number of measurements was 1000. In FIG. 14, $H_{min}$ represents a minimum value, $H_{25\%}$ represents a 25th percentile value, $H_{50\%}$ represents a 50th percentile value (median), $H_{75\%}$ represents a 75th percentile values, and represents a maximum $H_{max}$ value. When measured values are arranged from lowest to highest, a value located a % from the first of the measured values is referred to as an α-th percentile value. It is clearly shown in FIG. 14 that the glass near the end surface 23 of the glass substrate 2 after the irradiation with the gas clusters is softer than that before the irradiation with the gas clusters.

Second Example

In the second example, the notch surface 26 of the same glass substrate 2 as that in the first example was directly irradiated with the gas clusters 129. As raw material gas for the gas clusters 129, tetrafluoromethane ($CF_4$) gas was used, in which the element (A) other than fluorine (F) was carbon (C). After the irradiation with the gas clusters 129, a composition analysis for the notch surface 26 of the glass substrate 2 was performed by using the TOF-SIMS. A sample for the composition analysis was cut out from a corner including the notch surface 26 of the glass substrate 2, and fixed to the holding tool so that the notch surface 26 was made substantially horizontal facing upward. For the composition analysis of the notch surface 26, TOF.SIMS 5 by IONTOF GmbH was used.

Figure 15:
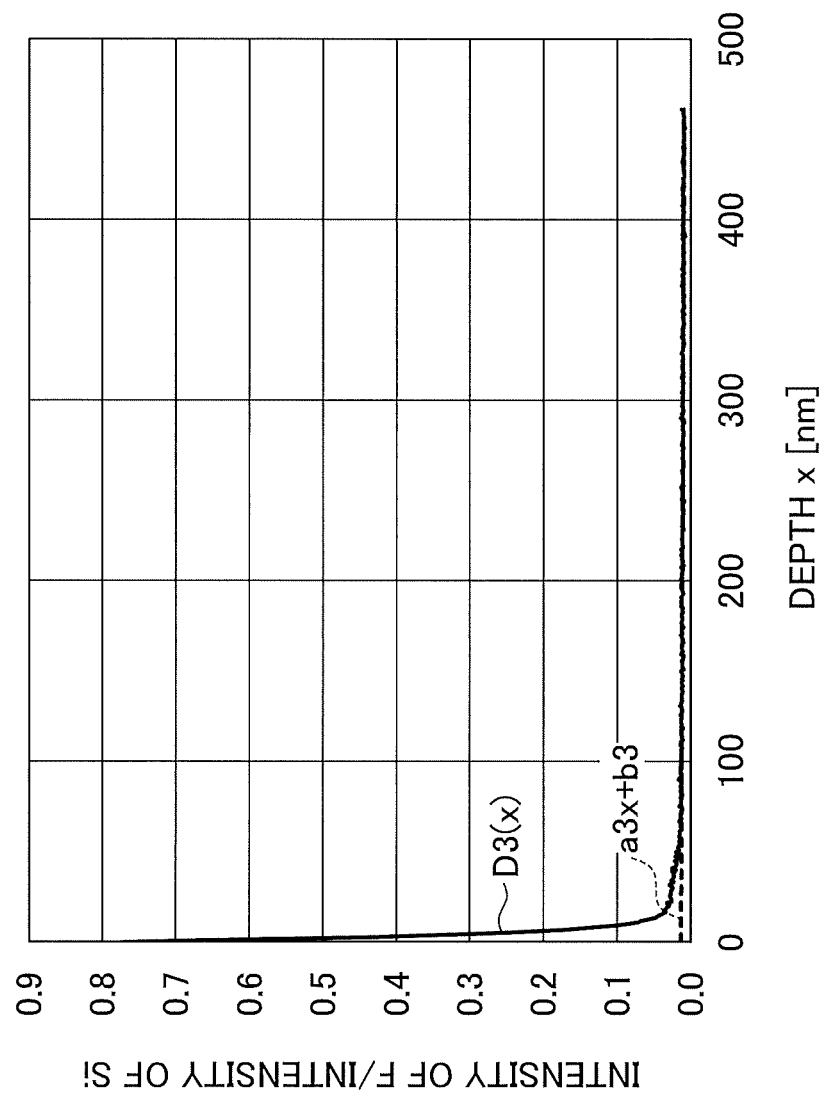
FIG. 15 shows a distribution in depth direction of a ratio of a fluorine (F) intensity to a silicon (Si) intensity obtained by measuring the notch surface of the glass substrate according to the second example using TOF-SIMS.

FIG. 15 shows a distribution in depth direction of a ratio of a fluorine (F) intensity to a silicon (Si) intensity obtained by measuring the notch surface 26 of the glass substrate 2 of the second example using the TOF-SIMS. It is clearly shown in FIG. 15 that fluorine (F) atoms were implanted near the notch surface 26 of the glass substrate 2. The value of S3 on the left-hand side of the above-described relation (3) was 4.83. Moreover, the composition analysis for the notch surface 26 performed before the irradiation with the gas clusters 129 using the TOF-SIMS shows that the value of S3 was 0.139.

Figure 16:
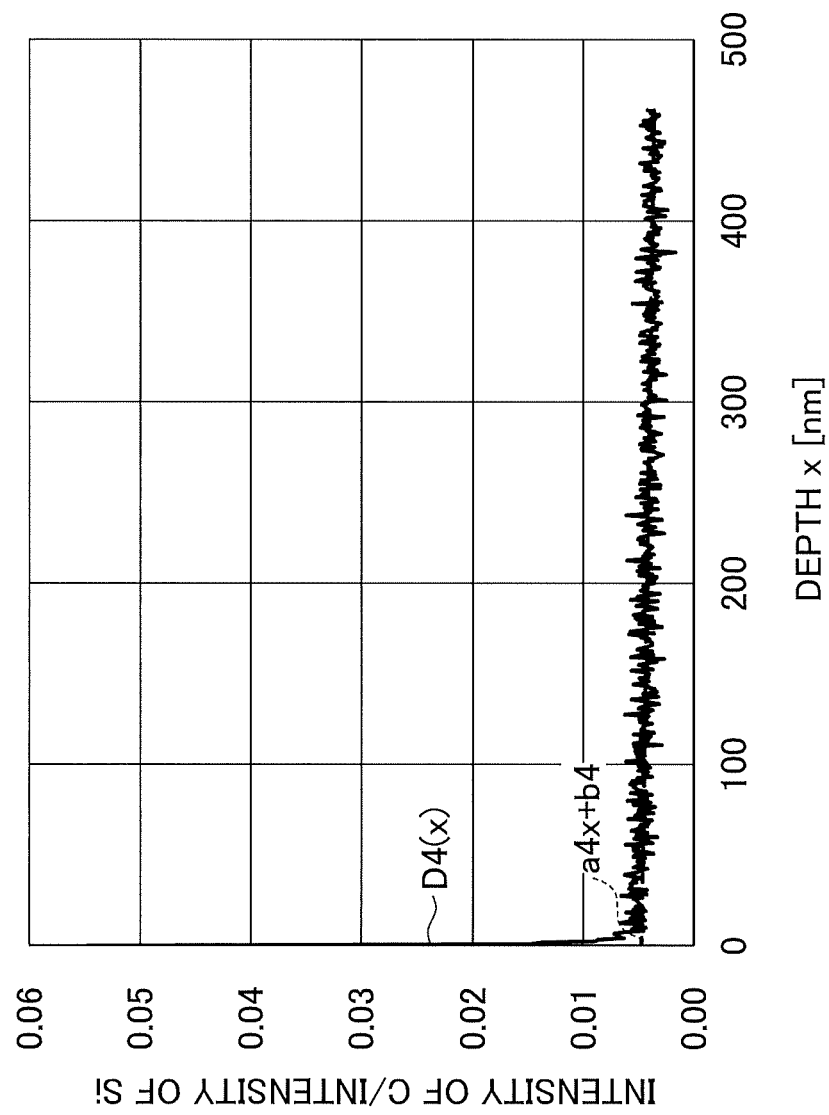
FIG. 16 shows a distribution in depth direction of a ratio of a carbon (C) intensity to a silicon (Si) intensity obtained by measuring the notch surface of the glass substrate according to the second example using TOF-SIMS.

Moreover, FIG. 16 shows a distribution in depth direction of a ratio of a carbon (C) intensity to a silicon (Si) intensity obtained by measuring the notch surface 26 of the glass substrate 2 of the second example using the TOF-SIMS. It is clearly shown in FIG. 16 that carbon (C) atoms were implanted near the notch surface 26 of the glass substrate 2. The value of S4 on the left-hand side of the above-described relation (4) was 0.114. Moreover, the composition analysis for the notch surface 26 performed before the irradiation with the gas clusters 129 using the TOF-SIMS shows that the value of S4 was 0.017.

According to the above-described results, the notch surface 26 of the glass substrate 2 of the second example is also found to become soft by the irradiation with the gas clusters 129, similarly to the end surface 23 of the glass substrate 2 of the first example.

As described above, the glass substrate for EUVL, the manufacturing method thereof, the mask blank for EUVL, and the manufacturing method thereof have been described. However, the present disclosure is not limited to the above-described embodiments, but various variations, modifications, replacements, additions, deletions, and combinations may be made without departing from the scope recited in claims. They naturally belong to the technical scope of the present disclosure.

What is claimed is:

1. A glass substrate for Extreme Ultra-Violet Lithography (EUVL) comprising:
    a first main surface having a rectangular shape;
    a second main surface having a rectangular shape and being on an opposite side to the first main surface;
    four end surfaces being orthogonal to the first main surface and the second main surface;
    four first chamfered surfaces formed on boundaries between the first main surface and the four end surfaces respectively; and
    four second chamfered surfaces formed on boundaries between the second main surface and the four end surfaces respectively,
    wherein the glass substrate for EUVL is formed of quartz glass containing titanium dioxide ($TiO_2$), and
    wherein the end surfaces include fluorine (F) and an element (A) other than fluorine that forms a gas cluster with fluorine, and satisfy relations (1) and (2):

[Math 1]

$$1 = \int_0^{x=50[nm]} \{D1(x) - (a1x+b1)\}dx > 0.2 \quad (1)$$

[Math 2]

$$S2 = \int_0^{x=50[nm]} \{D2(x) - (a2x+b2)\}dx > 0.03 \quad (2)$$

where D1(x) in the relation (1) represents an intensity of fluorine (F) normalized with an intensity of silicon (Si) measured by Time-of-Flight Secondary Ion Mass Spectrometry (TOF-SIMS), x represents a depth from the end surface (in units of nm), a1x+b1 represents a linear expression in terms of x obtained by approximating D1(x) using a least squares method for x which is greater than or equal to 200 and less than or equal to 400, D2(x) in the relation (2) represents an intensity of the element (A) normalized with an intensity of silicon (Si) measured by the TOF-SIMS, x represents a depth from the end surface (in units of nm), and a2x+b2 represents a linear expression in terms of x obtained by approximating D2(x) using the least squares method for x which is greater than or equal to 200 and less than or equal to 400.

2. A glass substrate for Extreme Ultra-Violet Lithography (EUVL) comprising:
a first main surface having a rectangular shape;
a second main surface having a rectangular shape and being on an opposite side to the first main surface;
four end surfaces being orthogonal to the first main surface and the second main surface;
four first chamfered surfaces formed on boundaries between the first main surface and the four end surfaces respectively;
four second chamfered surfaces formed on boundaries between the second main surface and the four end surfaces respectively; and
one or more notch surfaces formed as inclined toward the first main surface so as to cut off a corner of the two adjacent end surfaces and the first main surface,
wherein the glass substrate for EUVL is formed of quartz glass containing titanium dioxide ($TiO_2$), and
wherein the notch surface includes fluorine (F) and an element (A) other than fluorine that forms a gas cluster with fluorine, and satisfies relations (3) and (4):

[Math 3]

$$S3 = \int_0^{x=50[nm]} \{D3(x) - (a3x+b3)\}dx > 0.2 \quad (3)$$

[Math 4]

$$S4 = \int_0^{x=50[nm]} \{D4(x) - (a4x+b4)\}dx > 0.3 \quad (4)$$

where D3(x) in the relation (3) represents an intensity of fluorine (F) normalized with an intensity of silicon (Si) measured by Time-of-Flight Secondary Ion Mass Spectrometry (TOF-SIMS), x represents a depth from the notch surface (in units of nm), a3x+b3 represents a linear expression in terms of x obtained by approximating D3(x) using a least squares method for x which is greater than or equal to 200 and less than or equal to 400, D4(x) in the relation (4) represents an intensity of the element (A) normalized with an intensity of silicon (Si) measured by the TOF-SIMS, x represents a depth from the notch surface (in units of nm), and a4x+b4 represents a linear expression in terms of x obtained by approximating D4(x) using the least squares method for x which is greater than or equal to 200 and less than or equal to 400.

3. The glass substrate for EUVL according to claim 1, wherein the element (A) is carbon (C), boron (B), nitrogen (N), sulfur (S), selenium (Se), tellurium (Te), or tungsten (W).

4. The glass substrate for EUVL according to claim 2, wherein the element (A) is carbon (C), boron (B), nitrogen (N), sulfur (S), selenium (Se), tellurium (Te), or tungsten (W).

5. The glass substrate for EUVL according to claim 3, wherein the element (A) is carbon (C).

6. The glass substrate for EUVL according to claim 4, wherein the element (A) is carbon (C).

7. A mask blank for EUVL comprising:
the glass substrate for EUVL according to claim 1;
a reflection film for reflecting EUV light formed on the glass substrate for EUVL; and
an absorption film for absorbing the EUV light formed on the reflection film.

8. A mask blank for EUVL comprising:
the glass substrate for EUVL according to claim 2;
a reflection film for reflecting EUV light formed on the glass substrate for EUVL; and
an absorption film for absorbing the EUV light formed on the reflection film.

9. A method of manufacturing a glass substrate for EUVL, comprising:
irradiating the glass substrate for EUVL according to claim 1 with gas clusters each including fluorine (F) and the element (A) other than fluorine, to implant atoms of fluorine and the element (A) on the end surface.

10. A method of manufacturing a glass substrate for EUVL, comprising:
irradiating the glass substrate for EUVL according to claim 2 with gas clusters each including fluorine (F) and the element (A) other than fluorine, to implant atoms of fluorine and the element (A) on the notch surface.

11. The method of manufacturing a glass substrate for EUVL according to claim 9,
wherein the gas cluster includes $CF_4$, $CHF_3$, $CH_2F_2$, $C_2F_6$, $BF_3$, $NF_3$, $SF_6$, $SeF_6$, $TeF_6$, or $WF_6$.

12. The method of manufacturing a glass substrate for EUVL according to claim 10,
wherein the gas cluster includes $CF_4$, $CHF_3$, $CH_2F_2$, $C_2F_6$, $BF_3$, $NF_3$, $SF_6$, $SeF_6$, $TeF_6$, or $WF_6$.

13. The method of manufacturing a glass substrate for EUVL according to claim 11,
wherein the gas cluster includes $CF_4$, $CHF_3$, or $CH_2F_2$.

14. The method of manufacturing a glass substrate for EUVL according to claim 12,
wherein the gas cluster includes $CF_4$, $CHF_3$, or $CH_2F_2$.

15. A method of manufacturing a mask blank for EUVL, which includes the glass substrate for EUVL according to claim 1, a reflection film for reflecting EUV light formed on the glass substrate for EUVL, and an absorption film for absorbing the EUV light formed on the reflection film, the method comprising:
irradiating the glass substrate for EUVL with gas clusters each including fluorine (F) and the element (A) other than fluorine, to implant atoms of fluorine and the element (A) on the end surface.

16. A method of manufacturing a mask blank for EUVL, which includes the glass substrate for EUVL according to claim 2, a reflection film for reflecting EUV light formed on the glass substrate for EUVL, and an absorption film for absorbing the EUV light formed on the reflection film, the method comprising:

irradiating the glass substrate for EUVL with gas clusters each including fluorine (F) and the element (A) other than fluorine, to implant atoms of fluorine and the element (A) on the notch surface.

17. The method of manufacturing a mask blank for EUVL according to claim 15, wherein the gas cluster includes $CF_4$, $CHF_3$, $CH_2F_2$, $C_2F_6$, $BF_3$, $NF_3$, $SF_6$, $SeF_6$, $TeF_6$, or $WF_6$.

18. The method of manufacturing a mask blank for EUVL according to claim 16, wherein the gas cluster includes $CF_4$, $CHF_3$, $CH_2F_2$, $C_2F_6$, $BF_3$, $NF_3$, $SF_6$, $SeF_6$, $TeF_6$, or $WF_6$.

19. The method of manufacturing a mask blank for EUVL according to claim 17, wherein the gas cluster includes $CF_4$, $CHF_3$, or $CH_2F_2$.

20. The method of manufacturing a mask blank for EUVL according to claim 18, wherein the gas cluster includes $CF_4$, $CHF_3$, or $CH_2F_2$.

* * * * *